(12) United States Patent
Madocks

(10) Patent No.: US 8,304,744 B2
(45) Date of Patent: Nov. 6, 2012

(54) CLOSED DRIFT ION SOURCE

(75) Inventor: John Eric Madocks, Tucson, AZ (US)

(73) Assignee: General Plasma, Inc., Tucson, AZ (US)

( * ) Notice: Subject to any disclaimer, the term of this patent is extended or adjusted under 35 U.S.C. 154(b) by 200 days.

(21) Appl. No.: 12/311,920

(22) PCT Filed: Oct. 19, 2007

(86) PCT No.: PCT/US2007/081934
§ 371 (c)(1),
(2), (4) Date: Apr. 16, 2009

(87) PCT Pub. No.: WO2008/118203
PCT Pub. Date: Oct. 2, 2008

(65) Prior Publication Data
US 2010/0207529 A1    Aug. 19, 2010

Related U.S. Application Data

(60) Provisional application No. 60/852,926, filed on Oct. 19, 2006.

(51) Int. Cl.
*G21K 5/00* (2006.01)
(52) U.S. Cl. .................. 250/423 R; 250/424; 250/427; 313/588; 313/230; 313/231.01; 315/111.01; 315/111.21; 315/111.41; 315/111.81
(58) Field of Classification Search .............. 315/94, 315/111.01, 111.21, 111.41, 111.81, 500, 315/505; 313/230, 231.01, 588; 250/423 R, 250/424, 427
See application file for complete search history.

(56) References Cited

U.S. PATENT DOCUMENTS

| | | | |
|---|---|---|---|
| 3,735,591 | A | 5/1973 | Burkhart |
| 4,361,472 | A | 11/1982 | Morrison, Jr. |
| 4,849,087 | A | 7/1989 | Meyer |
| 4,851,095 | A | 7/1989 | Scobey et al. |
| 4,862,032 | A | 8/1989 | Kaufman et al. |
| 5,106,474 | A | 4/1992 | Dickey et al. |
| 5,218,271 | A | 6/1993 | Egorov et al. |
| 5,763,989 | A | 6/1998 | Kaufman |
| 5,838,120 | A | 11/1998 | Semenkin et al. |
| 5,855,745 | A | 1/1999 | Manley |
| 6,110,540 | A | 8/2000 | Countrywood et al. |
| 6,359,388 | B1 * | 3/2002 | Petrmichl ............... 315/111.81 |
| 6,454,910 | B1 | 9/2002 | Zhurin et al. |
| 6,456,011 | B1 | 9/2002 | Bugrova et al. |
| 6,734,434 | B1 | 5/2004 | Sainty |
| 7,259,378 | B2 | 8/2007 | Madocks |

(Continued)

FOREIGN PATENT DOCUMENTS
WO    WO 2008/118203 A2    10/2008

*Primary Examiner* — David A Vanore
*Assistant Examiner* — Nicole Ippolito
(74) *Attorney, Agent, or Firm* — Patent Procurement Services

(57) ABSTRACT

A closed drift ion source is provided, having an anode that serves as both the center magnetic pole and as the electrical anode. The anode has an insulating material cap that produces a closed drift region to further increase the electrical impedance of the source. The ion source can be configured as a round, conventional ion source for space thruster applications or as a long, linear ion source for uniformly treating large area substrates. A particularly useful implementation uses the present invention as an anode for a magnetron sputter process.

39 Claims, 2 Drawing Sheets

U.S. PATENT DOCUMENTS

| | | | |
|---|---|---|---|
| 2002/0145389 A1* | 10/2002 | Bugrova et al. | 315/111.81 |
| 2002/0163289 A1* | 11/2002 | Kaufman et al. | 313/361.1 |
| 2004/0020761 A1* | 2/2004 | Thomsen et al. | 204/192.12 |
| 2005/0082493 A1* | 4/2005 | Petrmichl | 250/423 R |
| 2006/0076872 A1* | 4/2006 | de Grys | 313/361.1 |

* cited by examiner

CLOSED DRIFT ION SOURCE

RELATED APPLICATION/CLAIM OF PRIORITY

This application is related to and claims priority from provisional application Ser. No. 60/852,926, filed Oct. 19, 2006, which provisional application is incorporated by reference herein.

FIELD

The present invention pertains to magnetically confined plasma and ion sources, in general, and to closed drift ion sources, in particular.

BACKGROUND

The present invention relates to magnetically confined plasma and ion sources for industrial processes such as plasma treatment, sputtering and plasma etching and to electric propulsion devices for space applications. Many closed drift ion sources have been proposed for these applications and several remain commercially viable. Publicly available articles by Kim and Zhurin, Kaufman and Robinson provide good general background information and other relevant references that pertain to magnetically confined plasma and ion sources. As described in these articles, prior art closed drift ion sources have both an inner and outer magnetic pole with a separate annular anode located between these poles. A closed drift magnetic field passes over the anode between these two grounded or electrically floating poles.

Extended Acceleration Channel Ion Sources

Past literature has divided closed drift ion sources into two classifications: Extended Acceleration Channel and Anode Layer. Although the demarcation is not consistent, the common dividing line is the ratio of channel width to channel depth. If the depth exceeds the width dimension, the ion source is classed as an extended acceleration channel type. In both this class and the anode layer class, an ion accelerating electric field is created in a racetrack shape by magnetic field lines roughly orthogonal to the electric field. Outside of this racetrack electrons move relatively freely without the presence of a magnetic field. As the electrons enter the ion source and attempt to reach the anode however, they are impeded by the crossing magnetic field lines. This causes the electrons to gyrate around and move along these magnetic field lines. An additional motion is a drift at right angles to both the magnetic and electric fields. This is termed the Hall current and is the purpose for the racetrack shape of the confinement region. In Madocks U.S. Pat. No. 7,259,378, assigned to a common assignee with the present invention, these motions are discussed in detail.

The Egorov U.S. Pat. No. 5,218,271 is typical of many extended acceleration channel sources in the prior art. Common to the prior art, this source has an annular anode with inner and outer high permeability magnetic poles. The Bugrova U.S. Pat. No. 6,456,011 B1 is of interest because this patent is directed to reducing the size of the ion source. The need for smaller, lighter ion sources is outlined. Bugrova reduces the source size by removing magnetic field generating components from the inner pole. The inner pole is still present but consists of only a high permeability material. The example given cites the outside diameter of the source to be 5 cm.

Anode Layer Ion Sources

Anode layer type ion sources are the second class of closed drift source. In anode layer sources, the closed channel depth is typically shorter or equal to the width. The closed drift published references discuss these sources. These sources have been commercialized for industrial uses. These sources were developed in Russia 40 years ago, and are largely considered public domain and few patents exist. However, U.S. Pat. Nos. 5,763,989 and 5,838,120 show typical configurations for an anode layer geometry. In the afore-mentioned U.S. Pat. No. 7,259,378, Madocks discloses an improved version of this source with pointed magnetic poles that focus the magnetic field in the magnetic gap. As can be seen in these and other anode layer ion sources, an annular anode is located between two, separate inner and outer magnetic poles.

End Hall Ion Sources

End hall ion sources are a variation of a closed drift ion source. In the end hall source, the inner magnet pole is lowered with respect to the outer pole to expose the sides of the annular anode. This is exemplified in both the Burkhart and Kaufman U.S. Pat. Nos. 3,735,591 and 4,862,032. With this geometry, a second electron confinement regime combines with a Penning style confinement of closed drift ion sources. The second confinement regime is mirror electron confinement in which electrons are partially confined along magnetic field lines by a gradient magnetic field. In the Burkhart and Kaufman patents and other prior art of this source type, e.g., Manley U.S. Pat. No. 5,855,745, the anode is again annular with the primary electron confining field lines passing from a central grounded or floating pole to an outer grounded or floating pole.

In the Sainty U.S. Pat. No. 6,734,434, a different end hall ion source configuration is presented. In Sainty the anode is not annular and there is no central floating pole. The anode fills the central area of the ion source and the magnetic field passes through the anode. Important to Sainty, the center of the anode is electrically conductive and is coated to insure the central top anode surface remains conductive. Electrons flowing from a filament reach the anode through the magnetic mirror at the center of the anode rather than by crossing magnetic field lines. This significantly lowers the impedance an electron experiences in trying to reach the anode and is different than the present invention.

Ion Sources with Sputter Magnetrons

The combination of sputter magnetron cathodes and closed drift ion sources is known in several configurations. In Morrison, Jr., U.S. Pat. No. 4,361,472, FIG. 13b shows a closed drift ion source connected as the anode to a sputter magnetron cathode. Morrison, Jr. teaches the use of separate power supplies to the cathode and anode (ion source) and the use of this tool in reactive sputtering. Scobey, U.S. Pat. No. 4,851,095, discloses another type of closed drift ion source using a sputter magnetron cathode to provide electrons to the ion source. In Scobey, separate power supplies are shown for the ion source and sputter magnetron cathode. In Manley, U.S. Pat. No. 5,855,745, an end Hall type ion source is used as the anode of a sputter magnetron cathode. Zhurin, U.S. Pat. No. 6,454,910, shows an Hall ion source with a sputter magnetron with separate power supplies for the ion source and sputter cathode.

Anodes for Sputter Magnetrons

Several prior art patents present apparatus for improved sputter magnetron anodes. In Meyer, U.S. Pat. No. 4,849,087, both inert and reactive gas is distributed in passageways though the anode. This is said to produce a stable plasma that uses the gases more efficiently. In this patent the anode is adjacent to the sputter magnetron and magnetic field lines are shown passing though the anode. Dickey, U.S. Pat. No. 5,106,474, teaches several anode configurations to maintain anode conductivity during magnetron sputtering of an insulating coating. FIGS. 8 through 11 show anodes with an array of magnets to guide electrons from the sputter cathode to the anode. Countrywood, U.S. Pat. No. 6,110,540, discloses a conductive anode that maintains conductivity by flowing inert gas through a pinhole and creating a plasma at the anode. In FIG. 7c of this patent the conductive anode is shown with plasma shaping magnets.

SUMMARY

The present invention discloses a novel closed drift ion source having an anode that serves as both the center magnetic pole and as the electrical anode. In accordance with one aspect of the invention, the anode has a layer of an insulating material or an insulating cap that insures a closed drift region of electron confinement to increase stability and the electrical impedance of the source. In accordance with other aspects of the invention, the novel ion source can be configured as a round, conventional ion source such as for space thruster applications or it may be configured as an elongate, linear ion source such as is useful for uniformly treating large area substrates. One of several particularly useful implementations uses the present invention as an anode for a magnetron sputter process.

BRIEF DESCRIPTION OF THE DRAWINGS

The invention will be better understood from a reading of the following detailed description of embodiments of the invention in conjunction with the drawing figures, in which like reference designators are used to identify like elements, and in which.

DETAILED DESCRIPTION

Figure 1:
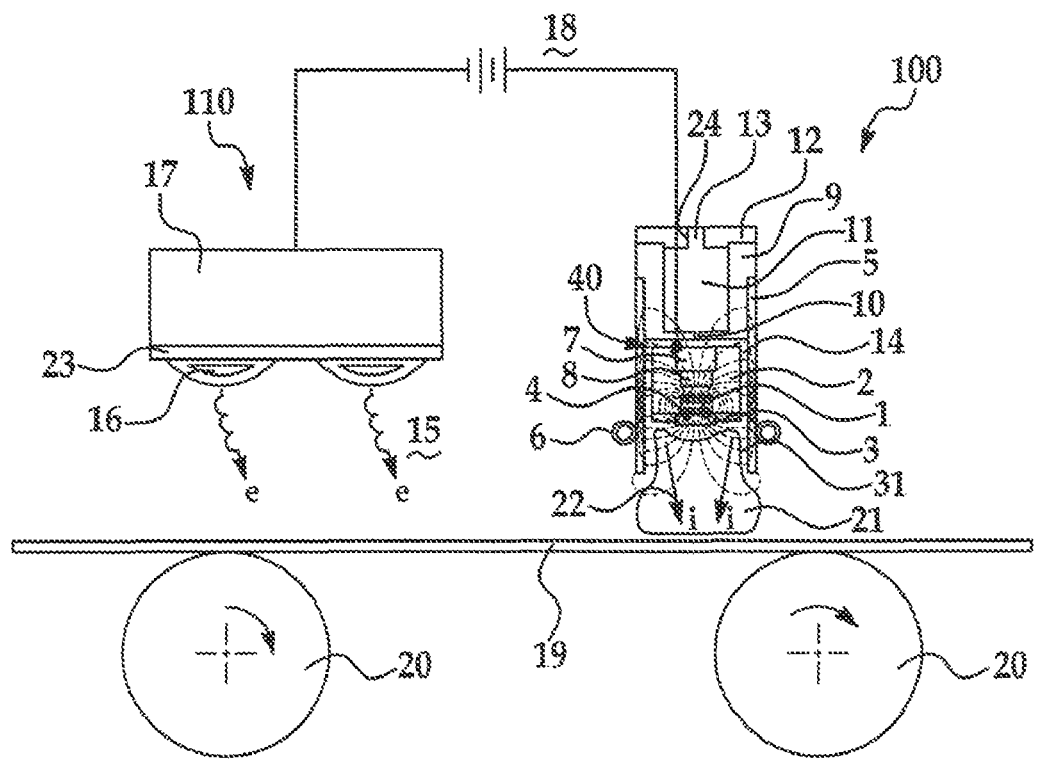
FIG. 1 is a longitudinal sectional view of a linear closed drift ion source with a sputter magnetron.
Figure 2:
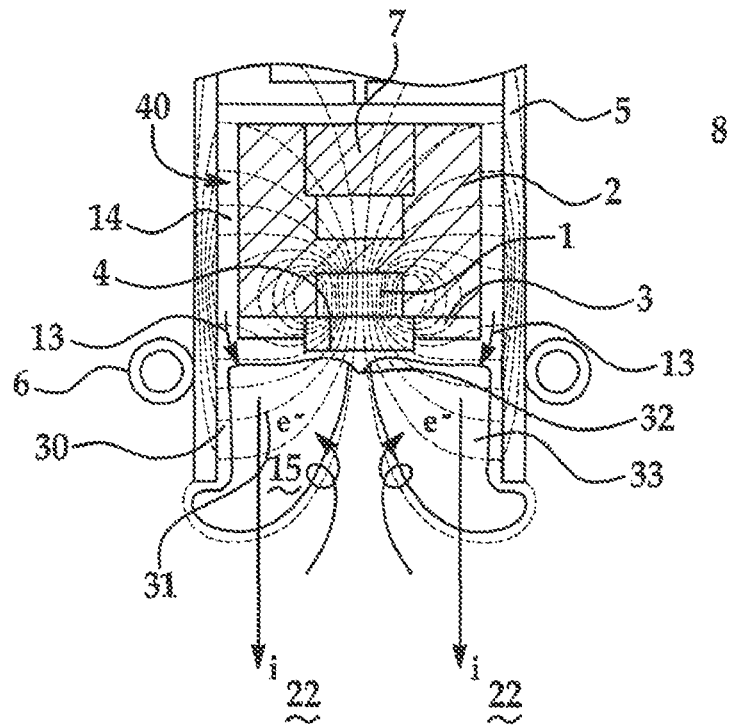
FIG. 2 is an enlarged detail view of the anode region of the linear closed drift ion source shown in FIG. 1.
Figure 3:
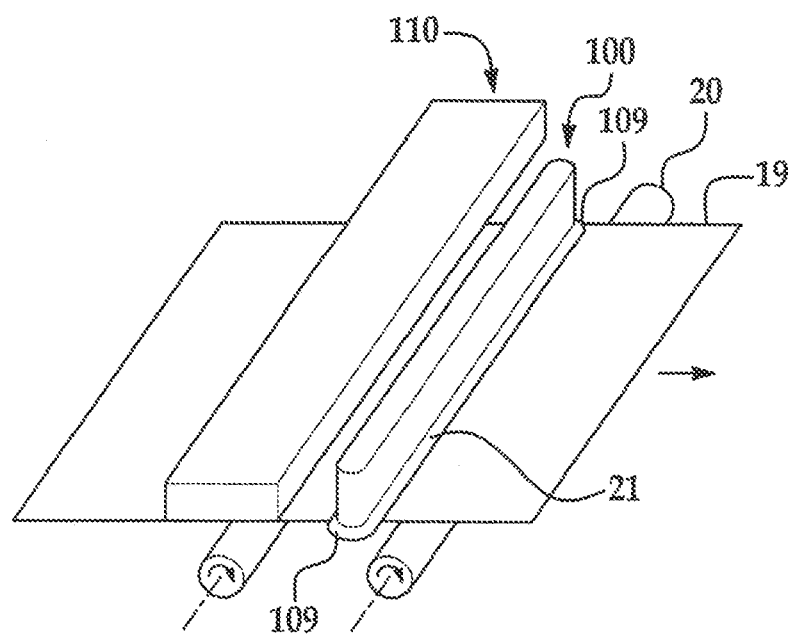
FIG. 3 is an isometric view of the linear closed drift ion source and sputter magnetron of FIG. 1.

FIGS. 1 and 3 linear closed drift ion source 100 in a glass sputter assist application. FIG. 3 shows an isometric view of closed drift ion source 100 with planar magnetron sputter source 110. Closed drift ion source 100 is installed over glass 19 in a vacuum process chamber that is not shown in the drawing figures. In this application closed drift ion source 100 is connected as the anode for magnetron sputter cathode 110 across power supply 18. Closed drift source 100 is supported over glass 19 by insulating brackets that are not shown. Glass 19 moves under cathode 110 and closed drift ion source 100 on conveyor rolls 20. As best seen in FIG. 2, closed drift ion source 100 includes an anode 40 inside floating steel shunt 5. Anode 40 comprises magnet 1, anode body 2, copper back plate 7 and anode top cover 3. Magnet 1 is located inside anode body 2 such that magnet 1 and anode 40 are formed as an integrated structure. Cover 3 is affixed or fastened to copper anode body 2 by flat head screws that are not shown. Anode 40 is water cooled via a milled groove 8. Copper back plate 7 is brazed over groove 8 to seal groove 8 to form a coolant, or in this embodiment water cavity. Inlet and outlet water fittings and piping are not shown. Shunt 5 is secured to floating housing 9 by fasteners not shown. Anode 40 is supported from housing 9 by insulating fasteners that are not shown. Anode 40 fits inside aluminum housing 9 and shunt 5 so that a dark space gap 14 is maintained around anode 40. Housing 9 contains a gas cavity 11. Gas 13 is brought into cavity 11 through opening 24 in steel back shunt 12. Gas fittings and piping are not shown and are well known in the art. Gas 13 flows into dark space 14 around anode 40 through a linear array of distribution holes 10 in housing 9. Shunt 5 is water cooled via welded or brazed-on piping 6. Ceramic shield 4 is secured over magnet 1 on anode 40 by copper cover 3. Shield 4 is not electrically conductive.

In FIG. 3 the elongate or linear nature of source 100 can be seen. Source 100 is shown as it is positioned over moving glass 19.

In operation, power supply 18 is turned on and magnetron cathode 110 ignites plasma 16. Magnetron cathode 110 sputters material from target 23 onto glass 19. Electrons 15 emanating from cathode 110 must reach anode 40 to return back to power supply 18. As electrons 15 attempt to reach anode 40, they are impeded by magnetic field lines 31 as more clearly seen in FIG. 2. To counter this resistance, power supply 18 creates a potential drop across the magnetic field 31 to encourage electron 15 flow to anode 40. Gas 13 flowing out of dark space 14 encounters impeded electrons 15 in confinement region 33 and some portion of gas 13 is ionized. These newly created ions 22 then experience the electric field and are accelerated away from anode 40 toward glass 19. Ions 22 bombard glass 19 and serve to increase the density of the thin film. If the ion source is placed upstream from the magnetron cathode, ion 22 bombardment serves to clean glass 19 surface prior to the sputter coating. A visually bright plasma 21 also is seen to emanate from source 100. This plasma 21 is also beneficial for treating and modifying a substrate surface.

The electron impeding magnetic field lines 31 passes though anode 40, insulating layer or ceramic shield 4, into the closed drift region 33 and then enters magnetic outer pole shunt 5. Electrons 15 entering the ion source to reach anode 40, are impeded by magnetic field lines 31 and begin to gyrate around these magnetic field lines. As the electrons 15 gyrate around the field lines 31, they move relatively freely along field lines 31. In the present invention, the electrons 15 are confined along field lines 31 by electrically floating surfaces at insulating cover 4 and shunt 5 surface 30. As is known in the art, floating surfaces tend to charge to repel electrons.

The insulating layer or cover 4 is important to the present invention and is against the teaching of Sainty in U.S. Pat. No. 6,734,434. With insulating layer or cover 4, electrons 15 cannot reach anode 40 by simply moving along magnetic field lines. In the present invention electrons must cross magnetic field lines 31 in confinement region 33 to reach anode 40. Forcing electrons 15 to cross field lines 31 creates a higher impedance and therefore higher energy ions.

In operation, linear closed drift ion source 100 generates a dense, uniform linear plasma 21 and ion beam 22 as seen in FIGS. 1 and 3. Plasma 21 and ion beam 22 are each uniform due to Hall direction forces and the closed drift configuration of the source 100. Electrons 15, trapped in magnetic confinement region 33, move around in a racetrack along the Hall direction. At the ends of linear ion source 100, the shunt 5 is rounded to maintain electron 15 confinement in a closed drift.

Referring back to FIG. 2, an advantage of the present invention over prior art closed drift ion sources is apparent. The primary magnetic field lines 31 pass through the anode 40 and insulating layer or cover 4, forcing electrons 15 to cross magnetic field lines 31 to reach anode 40. The primary magnetic field lines 31 are defined as the field lines forming the electron impeding closed drift region 33.

In prior art closed drift ion sources the primary magnetic field passed from an outer pole to an inner pole over an annular anode.

In accordance with the present invention, a central, non-annular anode 40 either houses the magnetic means 1 or the primary magnetic field 31 passes through anode 40.

In prior art ion source of U.S. Pat. No. 6,734,434 the primary magnetic field lines also pass through the anode. However, in U.S. Pat. No. 6,734,434 electrons are able to reach the anode without crossing magnetic field lines. U.S. Pat. No. 6,734,434 implements a mirror electron impedance between the anode and the cathode.

Further in accordance with the present invention operation, a ceramic, non-conductive layer or cover 4 blocks electrons 15 from reaching anode 40 along magnetic field lines 31. In ion source 100, electrons 15 must cross magnetic field lines 31 to reach anode cover 3. As is known in the art, electron 15 impedance across magnetic field lines 31 is higher than the impedance of a mirror magnetic field. This higher impedance results in important benefits.

One benefit is that the higher impedance produces a higher voltage across the closed drift region producing more energetic ions emanating out of the source.

An additional benefit is that electrons flowing toward anode 40 are more efficiently impeded and this results in more efficient ionization of gas 13.

The addition of ceramic insulating layer or cover 4 over anode 40 also benefits operation of present invention applied to a long linear ion source. Without cover 4, the anode 40 would be exposed to axial electron current flow similar to that of U.S. Pat. No. 6,734,434. In operating a long, linear source 100 without cover 4, the ion current emanating out of the source is not uniform. This is visually seen as a non-uniform glow across the length of the source. In particular the electron current appears to be greatest at the ends of the source (FIG. 3, 109) where bright spots are visible. With cover 4, the plasma glow 21 uniformity across the source is noticeably improved indicating a more uniform linear ion beam 22 emanates out of the ion source.

As an anode for a sputter magnetron cathode, linear ion source 100 has several advantages and uses.

One such advantage is that closed drift ion source 100 can replace an existing anode in a magnetron sputter cathode system. No new or additional power supplies are needed. Therefore the present invention can be easily and economically retrofitted into existing large area sputter systems.

Another such advantage is that source 100 bombards the glass with a dense, uniform ion beam 22 and plasma 21 over the full glass width.

A further advantage is that unlike earlier point source plasma anodes, the present invention produces a linear ion beam capable of uniformly treating the full substrate width.

One advantageous use is that by placing closed drift ion source 100 ahead of or before the magnetron, source linear plasma 21 and ion beam 22 can clean and prepare the substrate surface for sputter coating.

Another advantageous use is that by placing the closed drift ion source 100 after the magnetron, source plasma 21 and ion beam 22 can help to densify the sputtered coating and/or prepare the surface for the next sputtered film in a multi film process.

Advantageously, oxygen gas can be delivered directly into closed drift ion source 100 as the gas 13. The oxygen is then activated by the electrons 15 confined in closed drift region 33. This can reduce sputter target 23 poisoning in a reactive sputter process.

One additional advantage is that anode 40 is 'hidden' behind shunt 5 and plasma 21 and tends to remain conductive even during an insulating reactive sputter process.

Figure 4:
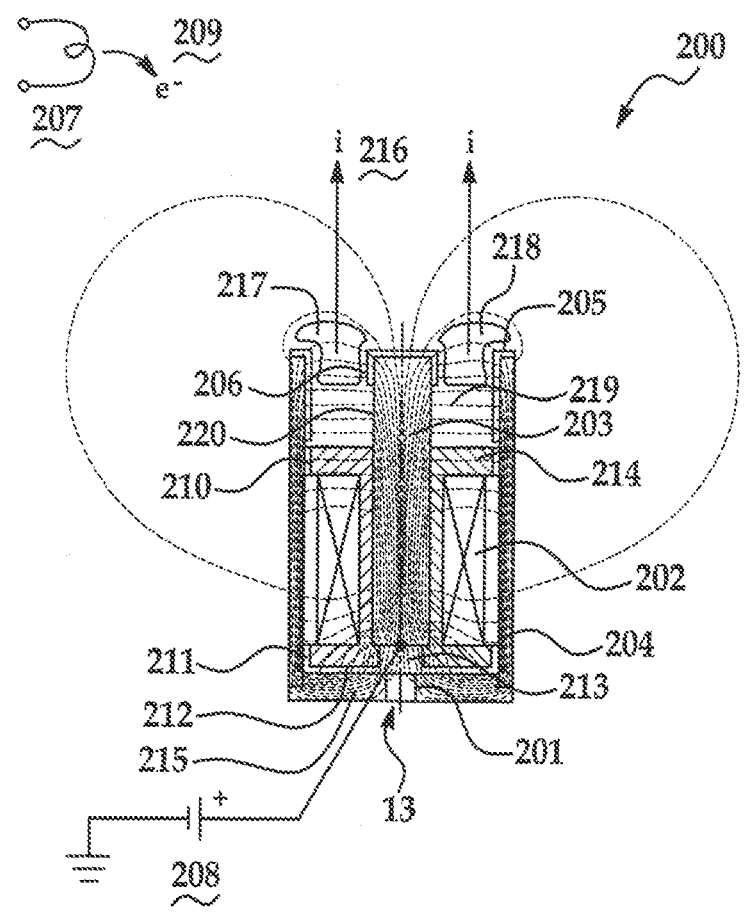
FIG. 4 is a sectional view of an annular closed drift ion source.

FIG. 4 shows a section view of another embodiment of the present invention. Ion source 200 is an annular source for space thruster or industrial ion source applications. In source 200, the central magnet pole of the closed drift circuit is anode 203 such that the central magnet pole and the anode are formed as an integrated structure. Anode 203 fits in the center of ceramic electromagnet spool 214 and is held in place by an insulating fastener through back shunt 215 not shown. Electromagnet 202 is wound on electrically insulating spool 214. Gas 13 flows through port 201 in back shunt 215 into void 213. From this void 213, gas 13 flows into multiple distribution vias 212, 211 and 210 in spool 214. After passing through vias 210, gas 13 flows into discharge cavity 219. External pole 204 is an annular tube around spool 214. Both anode 203 and external pole 204 are plasma coated with ceramic, insulating coatings 206 and 205 respectively. Importantly, a conducting portion 220 of center pole anode 203 is exposed to the discharge cavity 219.

An electron source 207 such as a hollow cathode or a filament supplies electrons 209 to create ions 216 and to neutralize ion 216 beam. Ion source power supply 208 is connected to anode 203. In operation, electrons leaving electron source 207 attempt to reach the electrically conductive surface 220 of anode 203. In the closed drift region 217, electrons are impeded by the radial magnetic field 218 and by insulating coatings 206 and 205. Trapped energetic electrons 209 ionize gas 13 in the closed drift region 217 in source 200. The newly created ions 216 are then ejected from the source due to the electric field in the closed drift region 217. The result is a dense ion beam emanating out of source 200.

In accordance with the principles of the invention, source 200 combines or integrates the inner, central magnetic pole and the anode into one component 203. All prior art closed drift ion sources have separate inner pole and anode components. In addition, all prior art anodes are annular in shape.

The combination of the inner pole and anode functions and the simplified anode shape have several advantages. One such advantage is that closed drift thruster sources for space applications can be made smaller and lighter. Minimizing source size and weight is a critical design concern for these applications. A further advantage is that the source is lower cost as a separate anode and anode support structure are not needed. The simplicity of source 200 makes it attractive for both industrial and space applications.

The present invention discloses two exemplary embodiments using the principles of the present invention. The two embodiments are indicative of the many variations possible using the principles of the present invention.

The closed drift ion source can be configured as round ion source or as a linear ion source with length exceeding 3 meters.

The closed drift ion source can be an anode for a sputter magnetron. In this application a single power supply between the cathode and ion source or two power supplies can be used. In the case of two power supplies, one is connected between the cathode and ground and the other between the anode and ground.

The electron source for the closed drift ion source can be a hollow cathode.

The power supplies can be DC, pulsed DC, AC or RF. With AC or RF, a blocking capacitor can be added to maintain a DC bias on the cathode or anode.

The ion source anode can contain ferromagnetic material to conduct the magnetic field, a magnet or can be constructed from non-magnetic material. The inventive criterion is that the primary closed drift magnetic field lines pass through the anode.

The invention has been described in terms of specific embodiments that have been shown and described. It will be apparent to those skilled in the art that various changes and modifications can be made to the embodiments and the variations that have been described herein without departing from the scope of the invention. It is not intended that the scope of the invention be limited by the embodiments and variations shown and/or described herein, but that the scope of the invention be limited only by the claims appended hereto.

I claim:

1. A closed drift ion source configured to produce an ion beam, said closed drift ion source comprising:
   an ionizable gas source;
   a cathode emitting electrons;
   an anode;
   a magnetic field source comprising a first magnetic pole and a second magnetic pole configured to produce a magnetic field that passes through said anode, a closed confinement region and into a magnetic outer pole shunt surface, said electrons being confined along said magnetic field by a first electrically floating surface intermediate between said electrons and said anode.

2. A closed drift ion source in accordance with claim 1, wherein:
   an insulating layer extends substantially perpendicular to said magnetic field.

3. A closed drift ion source in accordance with claim 2, wherein:
   said insulating layer comprises a ceramic material.

4. A closed drift ion source in accordance with claim 1, wherein:
   said anode and at least said first magnet pole are formed as one integrated component.

5. A closed drift ion source in accordance with claim 1, comprising:
   a magnet disposed within said anode to provide said first magnetic pole.

6. A closed drift ion source in accordance with claim 1, wherein:
   said anode comprises magnetically permeable material.

7. A closed drift ion source in accordance with claim 1, wherein:
   said anode is of substantially circular cross section such that said closed drift ion source is configured as a round ion source.

8. A closed drift ion source in accordance with in claim 1, wherein:
   said anode is elongate such that said closed drift ion source is configured as a linear ion source.

9. A closed drift ion source in accordance with claim 8, wherein:
   said closed drift ion source has a length at least 300 mm long.

10. A closed drift ion source in accordance with claim 9, wherein:
    said closed drift ion source is configured such that a uniform ion beam is produced over a predetermined width of a substrate disposed in a predetermined relationship to said closed drift ion source.

11. A closed drift ion source in accordance with claim 8, wherein:
    said closed drift ion source has a length at least 1000 mm long.

12. A closed drift ion source in accordance with claim 1, comprising:
    coolant fluid passages in fluid communication with said anode to provide cooling of said anode.

13. A closed drift ion source configured to produce an ion beam, said closed drift ion source comprising:
    an electron source;
    a magnetic field source comprising a center magnetic pole with a first and second magnetic poles such that said magnetic field source is integrated and in direct contact with a body of an anode, said anode serving as both a center magnetic pole and an electrical anode, where primary magnetic field lines extend between said first and said second magnetic poles;
    said anode being disposed and configured such that said primary magnetic field lines pass through said anode; and
    a closed drift confinement region that forces electrons to cross said primary magnetic field lines to reach said anode.

14. A closed drift ion source in accordance with claim 13, comprising:
    an insulating layer or an insulating cover is disposed on said anode such that electrons are prevented from reaching said anode until after they have crossed said closed drift confinement region.

15. A closed drift ion source in accordance with claim 14, wherein:
    said insulating layer is present and extends substantially perpendicular to said primary magnetic field lines.

16. A closed drift ion source in accordance with claim 14, wherein:
    said insulating layer comprises a ceramic material.

17. A closed drift ion source in accordance with claim 14, comprising:
    a magnet disposed within said anode to provide said first magnetic pole.

18. A closed drift ion source in accordance with claim 14, wherein:
    said anode comprises magnetically permeable material.

19. A closed drift ion source in accordance with claim 13, wherein:
    said anode and at least said first magnet pole are formed as one integrated component.

20. A closed drift ion source in accordance with claim 13, wherein:
    said anode is of substantially circular cross section such that said closed drift ion source is configured as a round ion source.

21. A closed drift ion source in accordance with in claim 13, wherein:
    said anode is elongate such that said closed drive ion source is configured as a linear ion source.

22. A closed drift ion source in accordance with claim 21, wherein:
    said closed drift ion source has a length at least 300 mm long.

23. A closed drift ion source in accordance with claim 22, wherein:
    said closed drift ion source is configured such that a uniform ion beam is produced over a predetermined width of a substrate disposed in a predetermined relationship to said closed drift ion source.

24. A closed drift ion source in accordance with claim 21, wherein:
    said closed drift ion source has a length at least 1000 mm long.

25. A closed drift ion source in accordance with claim 13, comprising:
coolant fluid passages in fluid communication with said anode to provide cooling of said anode.

26. A closed drift ion source in accordance with claim 13, wherein:
said electron source comprises a hollow cathode.

27. A closed drift ion source in accordance with claim 13, wherein:
said electron source comprises a sputter magnetron.

28. A closed drift ion source in accordance with claim 13, wherein:
said electron source comprises a thermionic filament.

29. A method for providing a closed drift ion source configured to produce an ion beam, said method comprising:
providing an ionizable gas source;
providing a cathode emitting electrons;
providing an anode;
providing a magnetic field from a magnetic field source comprising a first magnetic pole and a second magnetic pole, said magnetic field configured to pass through said anode, a closed confinement region and into a magnetic outer pole shunt surface, said electrons being confined along said magnetic field by a first electrically floating surface intermediate between said electrons and said anode.

30. A method in accordance with claim 29, wherein:
an insulating layer is present and disposed on said anode.

31. A method in accordance with claim 30, comprising:
providing said insulating layer on said anode, such that said insulating layer extends substantially perpendicular to a set of primary magnetic field lines.

32. A method in accordance with claim 30, wherein:
a ceramic material is utilized for said insulating layer.

33. A method in accordance with claim 30, comprising:
disposing a magnet within said anode to provide said magnetic field source.

34. A method in accordance with claim 30, comprising:
forming said anode from magnetically permeable material.

35. A method in accordance with claim 29, wherein:
forming said anode and said magnet field source as one integrated component.

36. A method in accordance with claim 29, comprising:
configuring said anode to be of substantially circular cross section such that said closed drift ion source is configured as a round ion source.

37. A method in accordance with in claim 29, comprising:
configuring said anode to be elongate such that said closed drift ion source is configured as a linear ion source.

38. A method in accordance with claim 29, comprising:
providing coolant fluid passages in fluid communication with said anode.

39. A method in accordance with claim 29, comprising:
configuring said closed drift ion source such that a uniform ion beam is produced over a predetermined width of a substrate disposed in a predetermined relationship to said closed drift ion source.

* * * * *